United States Patent
Hsiao et al.

(10) Patent No.: US 11,654,461 B2
(45) Date of Patent: *May 23, 2023

(54) PLASMA ASHING METHOD USING RESIDUE GAS ANALYZER

(71) Applicant: Taiwan Semiconductor Manufacturing Company, Ltd., Hsinchu (TW)

(72) Inventors: Chun-Jen Hsiao, Hsinchu (TW); Ya-Ping Chen, Hsinchu (TW); Chien-Hung Lin, Hsinchu (TW); Wen-Pin Liu, Hsinchu County (TW); Chin-Wen Chen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 19 days.

This patent is subject to a terminal disclaimer.

(21) Appl. No.: 17/326,430

(22) Filed: May 21, 2021

(65) Prior Publication Data
US 2021/0268555 A1    Sep. 2, 2021

Related U.S. Application Data

(63) Continuation of application No. 16/503,571, filed on Jul. 4, 2019, now Pat. No. 11,020,778.

(60) Provisional application No. 62/696,888, filed on Jul. 12, 2018.

(51) Int. Cl.
| | |
|---|---|
| *H01L 21/027* | (2006.01) |
| *G03F 7/42* | (2006.01) |
| *B08B 7/00* | (2006.01) |
| *H01J 37/32* | (2006.01) |

(52) U.S. Cl.
CPC ............ *B08B 7/0035* (2013.01); *G03F 7/427* (2013.01); *H01L 21/0273* (2013.01); *H01J 37/32082* (2013.01); *H01J 2237/335* (2013.01)

(58) Field of Classification Search
None
See application file for complete search history.

(56) References Cited

U.S. PATENT DOCUMENTS

| | | | |
|---|---|---|---|
| 7,169,440 B2 | 1/2007 | Balasubramaniam et al. | |
| 8,268,181 B2 | 9/2012 | Srivastava et al. | |
| 2004/0235299 A1* | 11/2004 | Srivastava | G03F 7/427 438/689 |
| 2005/0022839 A1 | 2/2005 | Savas et al. | |
| 2005/0079717 A1 | 4/2005 | Savas et al. | |
| 2008/0063810 A1* | 3/2008 | Park | C23C 16/4401 118/715 |
| 2014/0076353 A1 | 3/2014 | Berry et al. | |

OTHER PUBLICATIONS

Chinese language office action dated Dec. 21, 2020, issued in application No. TW 108124588.

\* cited by examiner

*Primary Examiner* — Shamim Ahmed
(74) *Attorney, Agent, or Firm* — McClure, Qualey & Rodack, LLP

(57) ABSTRACT

A plasma ashing method is provided. The plasma ashing method includes analyzing the process status of each of a number of semiconductor substrate models undergoing a tested plasma ash process by a residue gas analyzer. The tested plasma ash processes for the semiconductor substrate models utilize a plurality of tested recipes. The plasma ashing method further includes selecting one of the tested recipes as a process recipe for a plasma ash process.

20 Claims, 11 Drawing Sheets

US 11,654,461 B2

PLASMA ASHING METHOD USING RESIDUE GAS ANALYZER

CROSS REFERENCE TO RELATED APPLICATIONS

This application is a Continuation application of U.S. patent application Ser. No. 16/503,571, filed on Jul. 4, 2019, now U.S. Pat. No. 11,020,778, which claims priority of U.S. Provisional Patent Application No. 62/696,888, filed on Jul. 12, 2018, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

In the process of lithography, light of a given frequency is used to transfer a desired pattern onto a semiconductor substrate (e.g., a silicon wafer) undergoing semiconductor processing. A photomask (also referred to as a mask or reticle) is used to permit and prevent light in a desired pattern onto a material layer of the wafer, such as a photoresist (PR) layer, which chemically reacts to the light exposure, removing some portions of the PR layer and leaving other portions. The remaining PR layer is then used to pattern an underlying layer. During wafer processing, complete removal of the PR layer from the wafer (after patterning the underlying layer) is desired since photoresist material remaining on the wafer can cause defects in the fabricated semiconductor devices (e.g., integrated circuits).

Although existing photoresist removal apparatuses and methods have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1A:
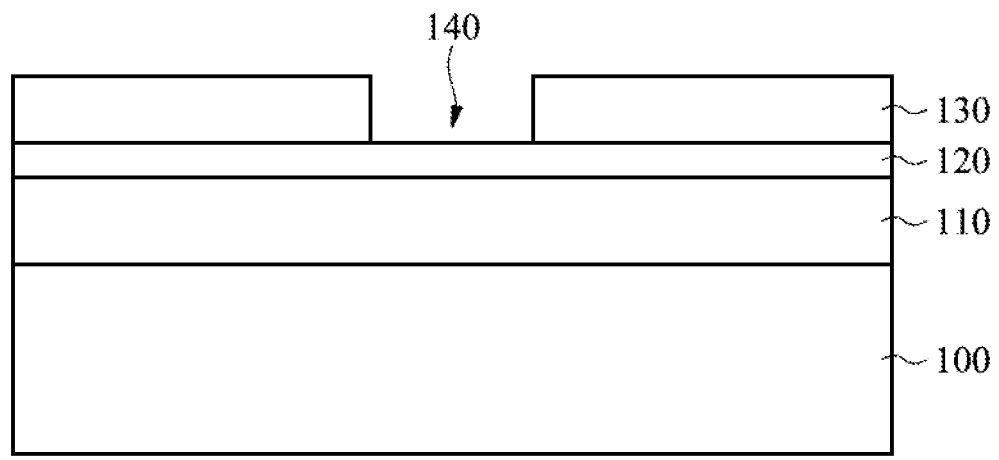
FIG. 1A is a cross-sectional view of a semiconductor substrate at an intermediate stage as the substrate is being processed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to a method for removing photoresist (PR) layer from a semiconductor substrate and a photoresist removal apparatus for implementing the method. The method utilizes a residue gas analyzer (RGA) provided in a photoresist removal apparatus to assist in tuning recipe (including process parameters) for the photoresist removal process so that the time required to remove the entire photoresist layer from the semiconductor substrate is reduced and fewer defects are generated during the photoresist removal process. In some embodiments, the RGA is further used to real-time monitor PR removal process status during the photoresist removal process. Therefore, it can avoid a lot of impact induced by tool etching rate shift or PR condition abnormal. Some variations of the embodiments are described. Throughout the various views and illustrative embodiments, like reference numbers are used to designate like elements.

Referring to FIGS. 1A-1F, which are cross-sectional views of a semiconductor substrate at respective sequential stages as the substrate is being processed in accordance with some embodiments. Starting with FIG. 1A, a semiconductor substrate 100 is a silicon substrate (e.g., silicon wafer), in some embodiments. However, the substrate 100 may alternatively be a germanium substrate or include any other suitable material. Furthermore, the substrate 100 may include a compound semiconductor such as silicon carbide, gallium arsenic, indium arsenide, or indium phosphide. Moreover, semiconductor arrangements such as silicon-on-insulator (SOI) and/or an epitaxial layer may alternatively be provided. The substrate 100 may also contain a variety of active or passive elements (not shown), such as, transistors, diodes, resistors, capacitors, and other suitable elements for integrated circuits.

A dielectric layer 110 is formed over the substrate 100. The dielectric layer 110, for example, can be a low-k fluoride-doped silicate glass (FSG), where k is the dielectric constant, in some embodiments. However, the dielectric layer 110 may alternatively include polyimide, Black Diamond® (a product of Applied Materials of Santa Clara, Calif.), Xerogel, Aerogel, amorphous fluorinated carbon, and/or any other suitable porous low-k material. The dielectric layer 110 is formed on the substrate 100 by a chemical vapor deposition (CVD) process, in some embodiments. Alternatively, the dielectric layer 110 may be formed by a low-pressure CVD (LPCVD), plasma-enhanced CVD (PECVD), high-density plasma CVD (HDPCVD), or by spin coating or another suitable process.

The dielectric layer 110 is employed as an intermetal dielectric (IMD) layer or interlayer dielectric (ILD) for forming interconnect lines between elements within the substrate 100, in some embodiments. For simplicity and clarity, one IMD layer is described here. However, it should be understood that the integrated circuits to be fabricated may alternatively contain more than one IMD layer as well as other insulating and metal layers for interconnecting the active and passive elements within the substrate 100.

A bottom anti-reflective coating (BARC) 120 is formed over the dielectric layer 110 by any of a variety of methods, such as spin coating or chemical vapor deposition (CVD), in some embodiments. For example, the BARC layer 120 can be made of silicon oxynitride. However, the BARC layer 120 may alternatively include silicon oxycarbide, silicon nitride, tantalum nitride, or any other suitable material, in some embodiments.

A photoresist (mask) layer 130 is formed over the BARC layer 120. The photoresist layer 130 has an opening 140 patterned therein by a lithography process (not shown). The lithography process patterns the photoresist layer 130 by exposing it to a radiation source through a mask (or reticle). The photoresist layer 130 includes a positive photoresist, in some embodiments. Alternatively, the photoresist layer 130 may include a negative photoresist or another suitable material. The radiation source is a suitable light source such as an ultra-violet (UV), deep ultra-violet (DUV), or extreme ultra-violet (EUV) source. For example, the radiation source can be, but is not limited to, a mercury lamp having a wavelength of 436 nm (G-line) or 365 nm (I-line); a krypton fluoride (KrF) excimer laser with wavelength of 248 nm; an argon fluoride (ArF) excimer laser with a wavelength of 193 nm; a fluoride ($F_2$) excimer laser with a wavelength of 157 nm; or other light sources having a wavelength below approximately 100 nm. The photoresist layer 130, in some embodiments, is developed by an alkaline developer, so that exposed portions of the photoresist layer 130 are removed, leaving the opening 140 in the photoresist layer 130. It should be understood that various techniques are available for patterning photoresist layer 130, and that lithography is only one example.

Figure 1B:
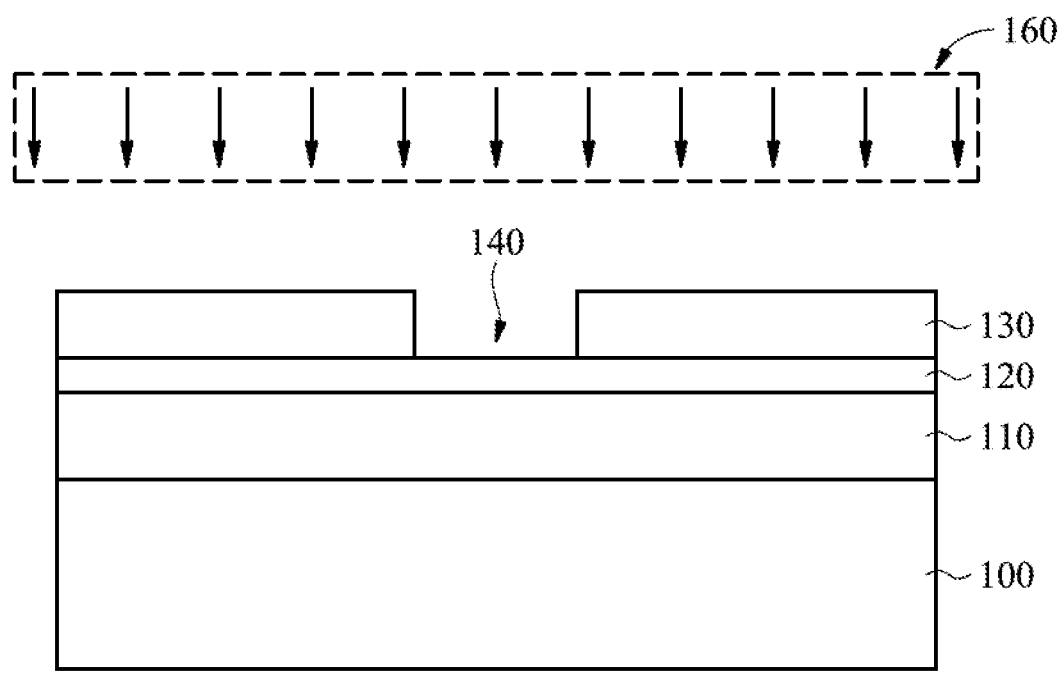
FIG. 1B is a cross-sectional view of a semiconductor substrate at an intermediate stage as the substrate is being processed in accordance with some embodiments.
Figure 1C:
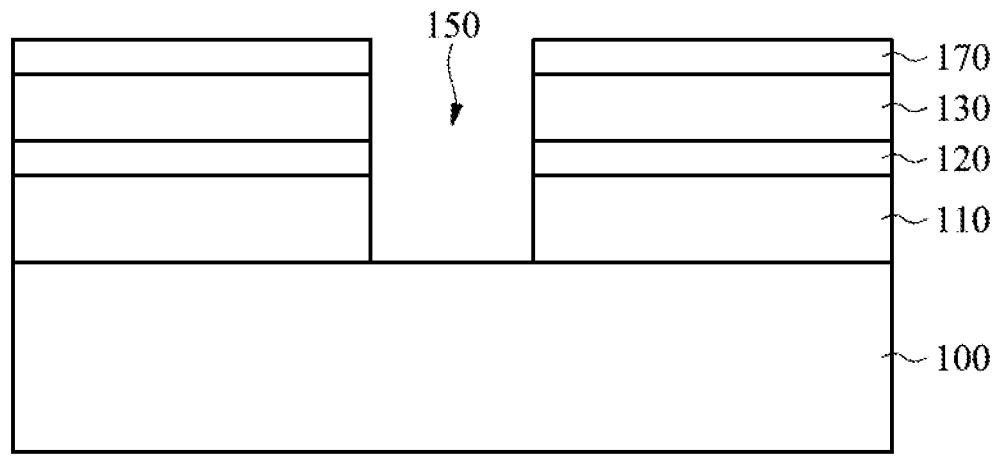
FIG. 1C is a cross-sectional view of a semiconductor substrate at an intermediate stage as the substrate is being processed in accordance with some embodiments.

Referring to FIGS. 1B and 1C, a feature 150 (such as a trench; see FIG. 1C) is formed in the dielectric layer 110 using the photoresist (mask) layer 130 with the opening 140. The opening 140 exposes a portion of the BARC layer 120. A dry etching process (not shown), in some embodiments, is performed to remove the exposed portion of the BARC layer 120 to form an etched BARC layer. However, the BARC layer 120 may alternatively be etched by a wet etch process, chemical etch process, or another suitable process. The trench 150 is then formed by a reactive ion etching (RIE) process 160 performed on the dielectric layer 110. Alternatively, the trench etching may be a continuation of the process used to etch the BARC layer 120, or some other suitable type of removal process.

During the reactive ion etching of the dielectric layer 110, ion bombardment of the photoresist layer 130 causes the outermost layer of the photoresist layer 130 to harden and a crust layer 170 is formed. The crust layer 170 is difficult to dissolve and requires aggressive chemistries to be used for removing the photoresist layer 130. Therefore, in some embodiments, a plasma ash process is then performed on the photoresist layer 130 including the crust layer 170 to remove the entire photoresist layer from the substrate 100. Using a plasma source, a reactive species, in some embodiments, is generated to combine with a photoresist layer to form ash which is then removed with a vacuum pump. For example, the plasma ash process may include a first plasma ash processing step and a second plasma ash processing step.

Figure 1D:
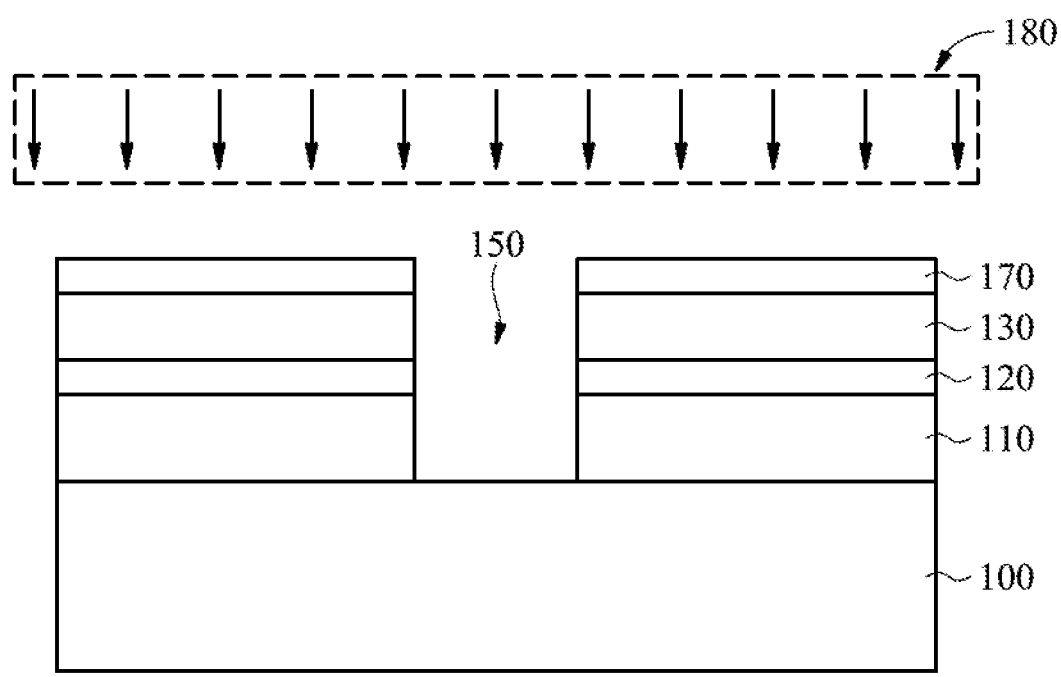
FIG. 1D is a cross-sectional view of a semiconductor substrate at an intermediate stage as the substrate is being processed in accordance with some embodiments.

Referring to FIG. 1D, a first plasma ash processing step is performed to remove the hardened curst layer 170 over the photoresist layer 130, in some embodiments. The first plasma ash processing step, for example, includes a photoresist stripping process 180. The photoresist stripping process 180 utilizes an etching chemistry (when being converted into a plasma, that can generate a reactive or etching species) and etching conditions suitable for softening and removing the curst layer 170, in some embodiments. For example, the etching chemistry includes a fluorine-containing gas (such as $CF_4$), an oxygen-containing gas (such as $O_2$), a nitrogen-containing gas (such as $N_2H_2$), other suitable gas, or a combination thereof.

Figure 1E:
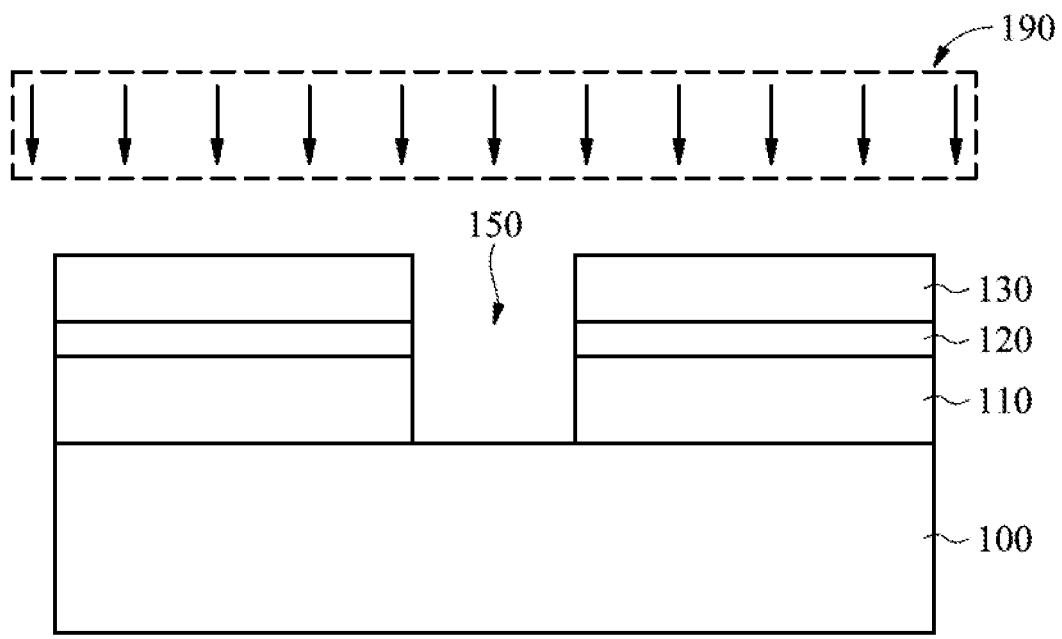
FIG. 1E is a cross-sectional view of a semiconductor substrate at an intermediate stage as the substrate is being processed in accordance with some embodiments.

Referring to FIG. 1E, a second plasma ash processing step is performed to remove the remaining portion of the photoresist layer, in some embodiments. For example, the second plasma ash processing step removes the photoresist layer 130 and any remaining hardened curst layer 170. The second plasma ash processing step may include a photoresist stripping process 190. The photoresist stripping process 190, in some embodiments, utilizes an etching chemistry (when being converted into a plasma, that can generate a reactive or etching species) and etching conditions suitable for removing the remaining portion of the photoresist layer. For example, the etching chemistry includes an oxygen-containing gas (such as $O_2$), a nitrogen-containing gas (such as $N_2H_2$), other suitable gas, or a combination thereof. In some embodiments, the photoresist stripping process 180 and the photoresist stripping process 190 implement different etching conditions (such as temperature, chamber pressure, and radio frequency (RF) power etc.).

It should be understood that the plasma ash process may further include an additional plasma ash processing step (not shown) after the first and second plasma ash processing steps. The additional plasma ash processing step is used to remove byproducts generated during the plasma ash process from the substrate 100. The additional plasma ash processing step includes a photoresist stripping process which utilizes an etching chemistry (when being converted into a plasma, that can generate a reactive or etching species) and etching conditions suitable for removing byproducts generated during the plasma ash process from the substrate 100 without damaging the low-k dielectric layer 110. For example, the etching chemistry includes an oxygen-containing gas (such as $O_2$), a nitrogen-containing gas (such as $N_2$), other suitable gas, or a combination thereof. In some embodiments, the etching conditions (such as temperature, chamber pressure, and radio frequency (RF) power etc.) for the additional plasma ash processing step are different from those for the second plasma ash processing step.

Figure 1F:
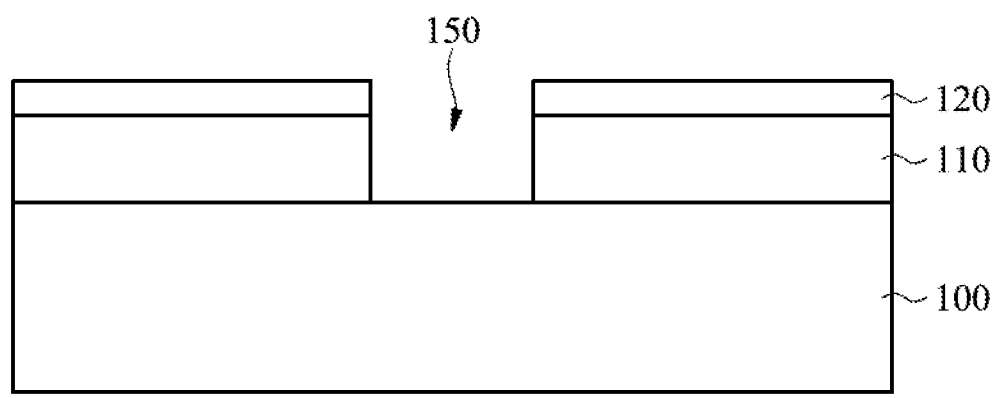
FIG. 1F is a cross-sectional view of a semiconductor substrate at an intermediate stage as the substrate is being processed in accordance with some embodiments.

With the plasma ash process described above, the remaining patterned photoresist layer 130 is removed completely from the substrate 100, as shown in FIG. 1F. The substrate 100 may continue with subsequent processing steps (not shown) to complete formation of the metal interconnect lines, such as filling the trench 150 with a conductive layer of copper, and planarizing the conductive layer and dielectric layer 110.

Figure 2:
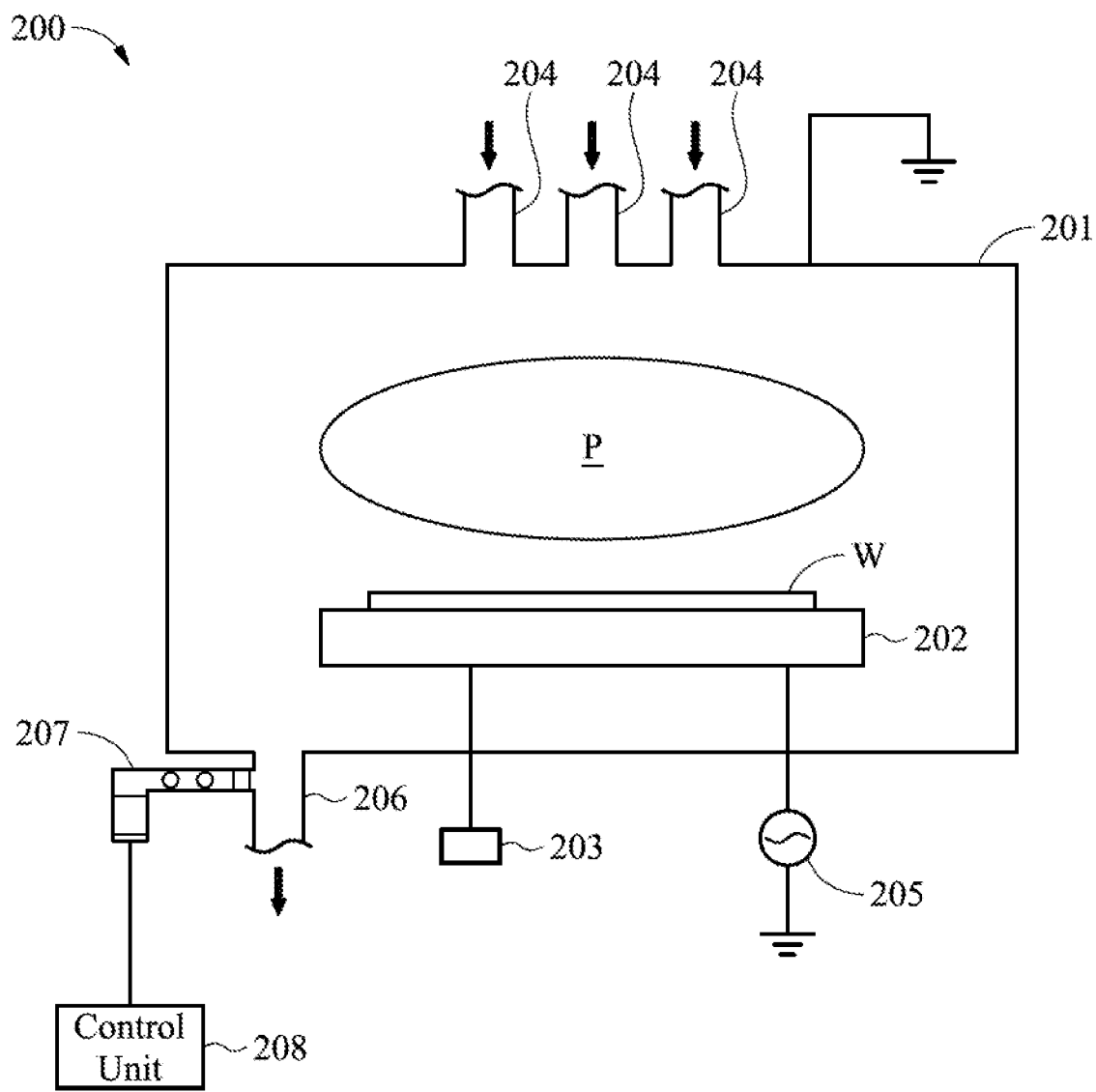
FIG. 2 is a schematic view of a photoresist removal apparatus in accordance with some embodiments.

Referring to FIG. 2, which schematically shows partial elements of a photoresist removal apparatus 200 in accordance with some embodiments. The photoresist removal apparatus 200 is configured to perform a plasma ash process (e.g., the plasma ash process described above) to remove the remaining patterned photoresist layer from a semiconductor substrate. It should be noted that some additional elements can be added into the photoresist removal apparatus 200 in FIG. 2, and some of the elements described below can be replaced or eliminated in other embodiments of the photoresist removal apparatus 200.

The photoresist removal apparatus 200 includes a processing chamber 201 (also referred to as a plasma chamber) having a substrate support device 202 therein. The substrate support device 202 is configured to support a semiconductor substrate W during a photoresist removal process (i.e., the plasma ash process). For example, the semiconductor substrate W may include a substrate 100, and patterned material layers 110, 120, a patterned photoresist layer 130 and a crust layer 170 formed over the substrate 100, as shown in FIG. 1C. The substrate support device 202 is an electrostatic chuck (ESC) that can secure the semiconductor substrate W using electrostatic force, in some embodiments. However, the substrate support device 202 may alternatively use mechanical, vacuum, or other clamping techniques to secure the semiconductor substrate W.

Moreover, a heater 203 is configured to heat the substrate support device 202 so that the temperature of the semiconductor substrate W on the substrate support device 202 is maintained within a range suitable for the plasma ash process. In some embodiments, the temperature of the plasma ash process is in a range about 190 degrees to about 210 degrees.

As required by the plasma ash process, a variety of process gases such as $CF_4$, $O_2$, $N_2H_2$, $N_2$ and the like are supplied into the processing chamber 201 through one or more gas inlets 204 (e.g., pipelines). Although not shown, each of the pipelines 204 is connected to a gas source, and a (throttle) valve is provided on the respective pipeline 204 for controlling the gas flow rate therein. Through an ionization process (i.e., ionizing the process gases), plasma P including a plurality of ions is generated in the processing chamber 201.

As shown in FIG. 2, the wall of the processing chamber 201 is used as a first electrode, which is connected to ground, in some embodiments. The substrate support device 202 in the processing chamber 201 is used as a second electrode, which is powered by a radio frequency (RF) power source 205. The first electrode and the second electrode form an electric field, through which the ions of the plasma P are accelerated. During the plasma ash process, the accelerated ions (also referred to a reactive or etching species) hit the unprotected surface of the semiconductor substrate W. As a result, the atoms on the unprotected surface of the semiconductor substrate W are dislodged so that a portion (e.g., the crust layer 170 and/or the patterned photoresist layer 130 shown in FIGS. 1C-1E) of the semiconductor substrate W is removed.

It should be noted that while FIG. 2 shows a single RF power source 205, the RF power source 205 may include two separate RF sources, namely a high frequency RF source and a low frequency RF source, in some embodiments. The high frequency RF source (not shown) is used to dissociate the process gases so as to generate the plasma P. On the other hand, the low frequency RF source (not shown) is mainly used to accelerate the ions of the plasma P so that the ion bombardment energy of the plasma P can be adjusted to a level suitable for the etching process for different semiconductor layers. That is, in order to adjust the etching rate, the amplitude of the low frequency RF source may be adjusted accordingly.

The processing chamber 201 may further include at least one gas outlet 206 (e.g., a pumping line). During the plasma ash process, a large amount of byproduct gas may be generated. Such byproduct gas may be removed continuously by a vacuum pump (not shown) through the pumping line 206. Although not shown, a (throttle) valve is provided on the pumping line 206 to control the gas flow rate therein, in some embodiments. By adjusting the gas flow rate in the gas inlets (pipelines) 204 and the gas flow rate in the gas outlet (pumping line) 206, the chamber pressure within the processing chamber 201 can be adjusted accordingly.

In the embodiments illustrated in FIG. 2, the photoresist removal apparatus 200 further includes a residue gas analyzer (RGA) 207. The residue gas analyzer 207, in some embodiments, can be installed on the pumping line 206 (e.g., positioned on the pumping line 206 close to the processing chamber 201) and is connected with and open to the processing chamber 201, so as to monitor in real-time the status of the photoresist removal process by analyzing the byproduct gas discharged from the processing chamber 201. In some embodiments, a Qualitorr Remote System (which is based on a quadrupole mass spectrometer) is used as a residue gas analyzer 207, but the present disclosure is not dependent on any particular type or design of mass spectrometer for its successful operation.

In general, a quadrupole mass spectrometer is built with four conductive rods that are symmetrically distributed around a common axis. Pairs of opposing rods are connected to direct current (DC) and RF voltage supplies. The gas that is to be analyzed is ionized by standard means (e.g., using filament for gas ionization) in an ionization area just ahead of the rods and then the ions are accelerated along the rods' common axis. For a given spacing between rod centers, the DC and RF voltages are chosen so as to allow ions of only a single mass (i.e., E/M ratio (the ratio of charge to mass)) to oscillate in stable orbits thereby reaching an ion detector located at the far end of the rods. The trajectories of all other ions are such that they spiral outwards and terminate at one of the rod surfaces. Ion mass resolution is increased by raising the RF frequency. Sensitivity is controlled by varying the ratio of DC to RF voltages. Detection of the ions is normally by means of electron multiplier or Faraday cup.

The ion detector of the residue gas analyzer 207 can detect the ion (current) signal of gas molecules (in the byproduct gas from the processing chamber 201) having a selected mass and convert the ion signal into a gas partial pressure through a software processing. Thus, the residue gas analyzer 207 can be used to real-time monitor the status of the photoresist removal process during the plasma ash process.

Figure 3:
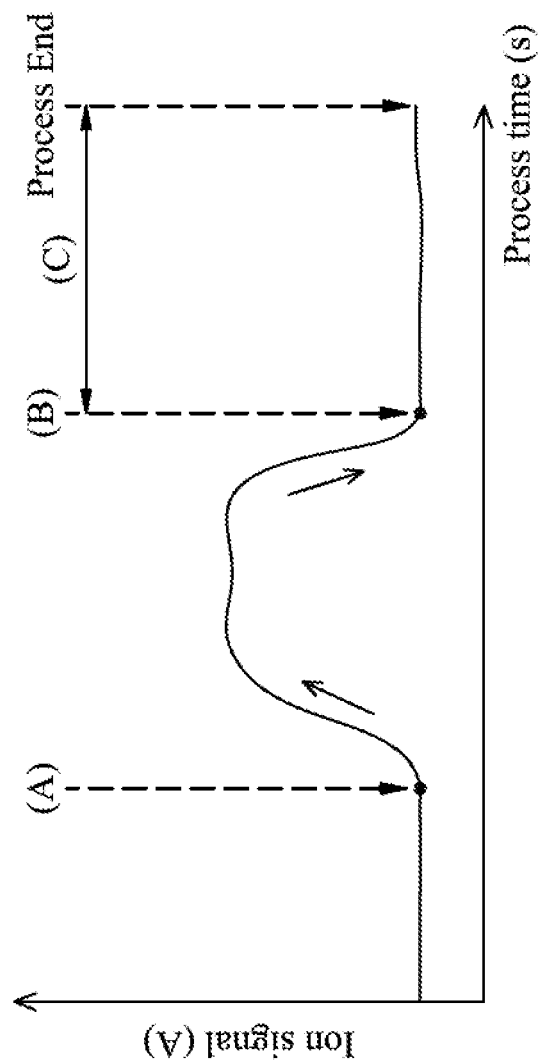
FIG. 3 is a diagram illustrating detection results of a residue gas analyzer during a plasma ash process in accordance with some embodiments.

For example, referring also to FIG. 3, which is a diagram showing detection results of the residue gas analyzer 207 during a plasma ash process in accordance with some embodiments. In this case, the residue gas analyzer 207 is operated to detect the ion signal of gas molecules (such as $CO_2$) having a selected mass in the byproduct gas generated during a plasma ash process. However, the selected and detected gas molecules in the byproduct gas may be other suitable gas that can indicate the status of the photoresist removal process.

It can be known from the detection results (i.e., a change in the detected ion signal) illustrated in FIG. 3 that the crust layer 170 (FIG. 1D) is completely removed at (time) point A (also referred to as the point of crust open). It should be understood that, when the process gases or the plasma P removes the crust layer 170 and begins to react with the photoresist layer 130 (FIGS. 1D-1E) under the crust layer 170, the amount of $CO_2$ generated begins to gradually increase. Furthermore, from the detection results illustrated in FIG. 3, it can be known that the (time) point B at which the remaining photoresist layer 130 is completely removed. It should be understood that, when the remaining photoresist layer 130 is completely removed, the amount of $CO_2$ generated decreases or returns to a relatively low level. Moreover, from the detection results illustrated in FIG. 3, it can obtain the period C of over etch (or ash), that is, the time interval between the point B and the predetermined (plasma ash) process end point.

It should be understood that the photoresist removal process is expected to have a short photoresist removal time and few defects generated during the photoresist removal process. The following embodiments provide a method of using the residue gas analyzer described above to assist in fine-tuning recipe (i.e., the process parameters) for the photoresist removal process so that the time required to remove the entire photoresist layer from the semiconductor substrate is reduced and fewer defects are generated during the photoresist removal process.

Figure 4:
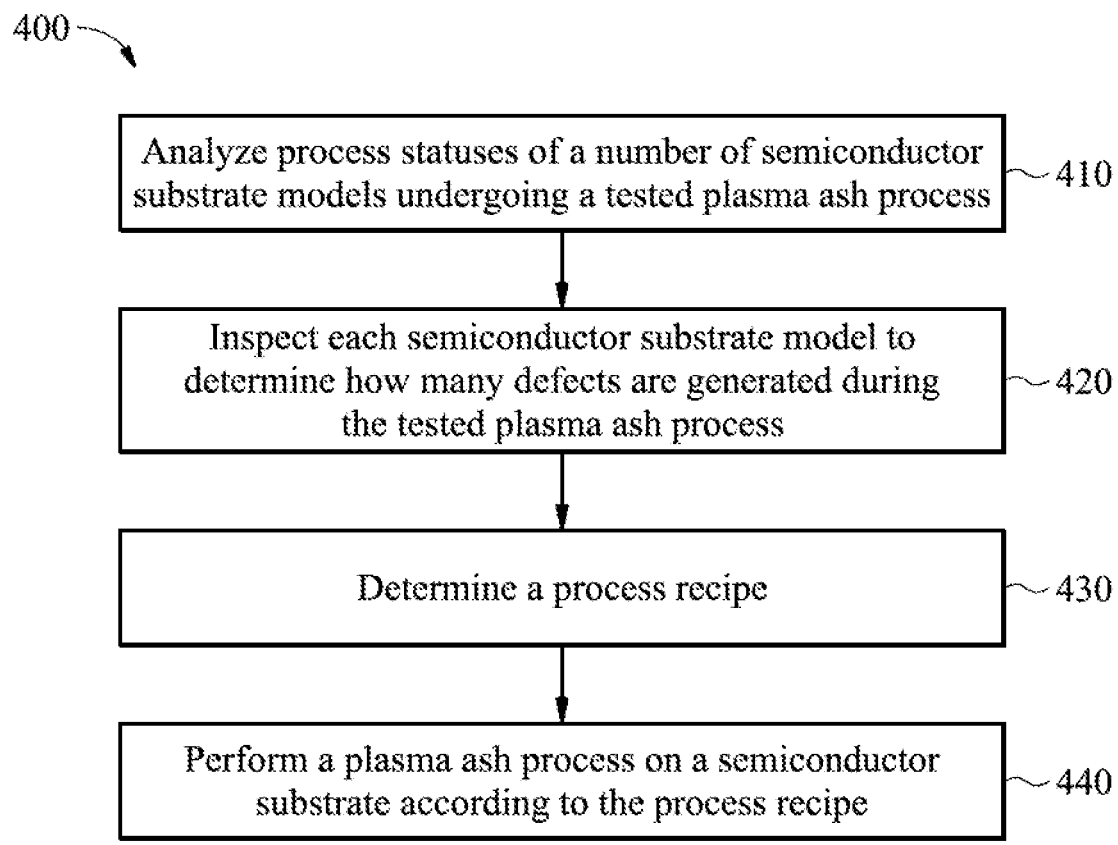
FIG. 4 is a simplified flowchart of a photoresist removal method in accordance with some embodiments.

Referring to FIG. 4, which is a simplified flowchart of a photoresist removal method 400 in accordance with some embodiments. For illustration, the flow chart will be described with reference to the schematic views shown in FIGS. 2 and 5. Some of the operations described below can be replaced or eliminated in different embodiments. Alternatively, some operations may be added in different embodiments. The photoresist removal method 400 includes a number of operations (410, 420, 430, 440).

In operation 410, a number of semiconductor substrate models are first provided. The semiconductor substrate models (not shown) have the same structural configuration as a semiconductor substrate (e.g., the semiconductor substrate W (FIG. 2) including a substrate 100, and patterned material layers 110, 120, a patterned photoresist layer 130 and a crust layer 170 formed over the substrate 100, as shown in FIG. 1C) that is to be subjected to a photoresist removal process. In some embodiments, as a batch of semiconductor substrates formed by the same fabrication processes is to be subjected to a photoresist removal process, the first few semiconductor substrates are referred to as the semiconductor substrate models.

Figure 5:
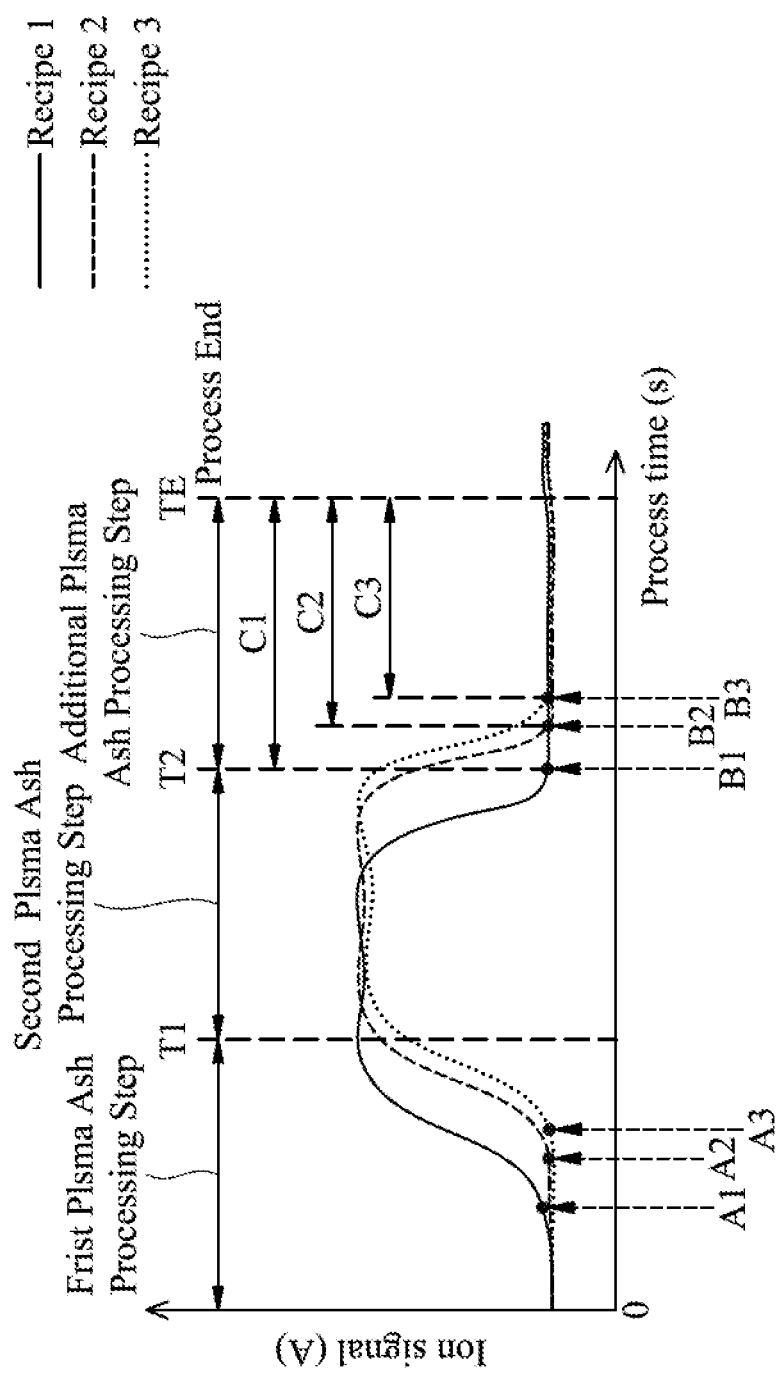
FIG. 5 is a diagram illustrating detection results of a residue gas analyzer during plasma ash processes with different tested recipes for semiconductor substrate models in accordance with some embodiments.

The semiconductor substrate models are then subjected to a "tested" plasma ash process described above (e.g., in the photoresist removal apparatus 200 as shown in FIG. 2) to remove a photoresist layer from each of the semiconductor substrate models. The plasma ash process includes a first plasma ash processing step, a second plasma ash processing step, and an additional plasma ash processing step in some embodiments as shown in FIG. 5. The functions of the first, second, and additional plasma ash processing steps have been described above, and are not repeated here.

In some embodiments, the recipe (including a set of process parameters such as process gas type, gas flow rate, RF power, and chamber pressure etc.) in the first plasma ash processing step are different from the recipe in the second plasma ash processing step. For example, the process gases supplied in the first plasma ash processing step may include $CF_4$, $O_2$ and $N_2H_2$, and the process gases supplied in the second plasma ash processing step may include $O_2$ and $N_2H_2$. The gas flow rate in the first plasma ash processing step may be lower than that in the second plasma ash processing step. The RF power and the chamber pressure in the first plasma ash processing step may be lower than those in the second plasma ash processing step.

In some embodiments, the recipe (including a set of process parameters such as process gas type, gas flow rate, RF power, and chamber pressure etc.) in the additional plasma ash processing step are different from the recipe in the second plasma ash processing step. For example, the process gases supplied in the additional plasma ash processing step may include $O_2$ and $N_2$, and the process gases supplied in the second plasma ash processing step may include $O_2$ and $N_2H_2$. The gas flow rate in the additional plasma ash processing step may be lower than that in the second plasma ash processing step (but greater than the gas flow rate in the first plasma ash processing step). The RF power and the chamber pressure in the additional plasma ash processing step may be lower than those in the second plasma ash processing step (but greater than the RF power and the chamber pressure in the first plasma ash processing step).

The "tested" plasma ash processes for the semiconductor substrate models utilize various "tested" recipes. In some embodiments, the number (e.g., three) of tested recipes corresponds to the number (e.g., three) of the semiconductor substrate models, that is, one tested recipe corresponds to one semiconductor substrate model. However, the number of tested recipes may be less than the number of the semiconductor substrate models, and each tested recipe corresponds to several semiconductor substrate models. For example, several tested recipes (each including a set of "tested" process parameters) utilized in the photoresist removal apparatus 200 (FIG. 2) during the "tested" plasma ash process are illustrated in Table 1.1 below.

TABLE 1.1

| Recipe No. | Process parameters | First plasma ash processing step | Second plasma ash processing step | Additional plasma ash processing step |
|---|---|---|---|---|
| 1 | Process gases | $CF_4, O_2, N_2H_2$ | $O_2, N_2H_2$ | $O_2, N_2$ |
|   | Gas flow rate | R11, R12, R13(sccm) | R14, R15(sccm) | R16, R17(sccm) |
|   | RF Power | W11(W) | W12(W) | WT3(W) |
|   | Chamber Pressure | P11(mtorr) | P12(mtorr) | P13(mtorr) |
| 2 | Process gases | $CF_4, O_2, N_2H_2$ | $O_2, N_2H_2$ | $O_2, N_2$ |
|   | Gas flow rate | R21, R22, R23(sccm) | R24, R25(sccm) | R26, R27(sccm) |
|   | RF Power | W21(W) | W22(W) | W23(W) |
|   | Chamber Pressure | P21(mtorr) | P22(mtorr) | P23(mtorr) |
| 3 | Process gases | $CF_4, O_2, N_2H_2$ | $O_2, N_2H_2$ | $O_2, N_2$ |
|   | Gas flow rate | R31, R32, R33(sccm) | R34, R35(sccm) | R36, R37(sccm) |
|   | RF Power | W31(W) | W32(W) | W33(W) |
|   | Chamber Pressure | P31(mtorr) | P32(mtorr) | P33(mtorr) |

It should be noted that while the above "tested" plasma ash processes with different tested recipes for the semiconductor substrate models have processing times of the same length, related to the first, second, and additional plasma ash processing steps (see FIG. 5), they are not limited thereto. For example, the processing times of the first, second, and additional plasma ash processing steps of the plasma ash processes related to the tested recipes may be the same or different in various embodiments.

In operation 410, the process status of each of the semiconductor substrate models undergoing the "tested" plasma ash process utilizing one tested recipe (i.e., one set of tested process parameters) shown in Table 1.1 is analyzed by a residue gas analyzer (e.g., the residue gas analyzer 207 shown in FIG. 2). The residue gas analyzer 207 detects the ion signal related to a selected type of gas molecule (such as $CO_2$) in the byproduct gas generated during the "tested" plasma ash process for each of the semiconductor substrate models, thereby real-time analyzing the process status of the semiconductor substrate model during the photoresist removal process. Referring back to FIG. 2, the residue gas analyzer 207 is connected to a control unit 208 (e.g., a computer system). The control unit 208 receives, stores the detection/analysis results from the residue gas analyzer 207, and displays the detection/analysis results (see FIG. 5) for the convenience of the operator, in some embodiments.

From the detection results (i.e., a change in the detected ion signal) illustrated in FIG. 5, it can be known that the process status of each semiconductor substrate model undergoing the "tested" plasma ash process utilizing one tested recipe (i.e., one set of tested process parameters including process gas type, gas flow rate, RF power, and chamber pressure, as well as processing time for each step in the plasma ash process). The process status includes a time point (A1, A2, A3) at which the crust layer 170 over the patterned photoresist layer 130 is removed (also referred to as a point of crust open), a time point (B1, B2, B3) at which the removal of the remaining patterned photoresist layer 130 ends, and a period of over ash (C1, C2, C3). The time point A1, time point B1, and period C1 correspond to the recipe 1. The time point A2, time point B2, and period C2 correspond to the recipe 2. The time point A3, time point B3, and period C3 correspond to the recipe 3.

In operation 420, after the "tested" plasma ash process described above, each of the semiconductor substrate models is removed from the photoresist removal apparatus 200 for inspection (e.g., optical inspection, electrical inspection, or other available type of inspection) to count the defects generated during the "tested" plasma ash process, remaining on the semiconductor substrate model. However, the inspection process may be performed in-situ by an inspection unit (not shown) provided by the photoresist removal apparatus 200 to find out an amount of defects generated during the "tested" plasma ash process. The inspection unit may use optical, electrical, or other available type of inspection mechanism. The inspection results may be stored in a database (not shown) of the control unit 208. In some other embodiments, operation 420 can be omitted.

In operation 430, based on the detection/analysis results of the residue gas analyzer 207 and at least one expected performance criterion for the photoresist removal process, select one tested recipe as a (desirable) process recipe. In some embodiments, the expected performance criteria include reducing the time required to remove the crust layer 170 (FIG. 1D). Furthermore, the expected performance criteria include reducing the time required to remove the remaining patterned photoresist layer 130 (FIGS. 1D-1E). Moreover, the expected performance criteria include reducing defects (e.g., unremoved fragments of the crust layer 170, photoresist layer 130, or other material layers, as well as over etching) generated during the plasma ash process. However, the expected performance criteria may include one or two of the above expected performance criteria, in some embodiments.

By analyzing the detection/analysis results of the residue gas analyzer 207 during the plasma ash processes with various tested recipes and the inspection results stored in the database, the control unit 208 selects or determines one (desirable) process recipe from the tested recipes for the plasma ash process, in some embodiments. For example, in the embodiments illustrated in FIG. 5, since the time point A1 is prior to the time points A2 and A3, the time point B1 is prior to the time points B2 and B3, and the defects generated during the plasma ash process utilizing the recipe 1 is also less (not shown), the recipe 1 is selected as the (desirable) process recipe for the plasma ash process for the subsequent semiconductor substrate(s).

It should also be understood that the selected process recipe may include a processing time of an appropriate length related to each of the first, second, and additional plasma ash processing steps, thereby avoiding too much over etching (e.g., the period of over ash C1 (FIG. 5) is expected not to be too long).

In operation 440, a plasma ash process is then performed on a semiconductor substrate (e.g., a subsequent semiconductor substrate in the same batch as the semiconductor substrate models) according to the determined process recipe to remove a photoresist layer from the semiconductor substrate. The time required to remove the entire photoresist layer from the semiconductor substrate is reduced and fewer defects are generated during the photoresist removal process (i.e., plasma ash process) with the process recipe determined by the above operations utilizing the RGA real-time monitoring.

Figure 6:
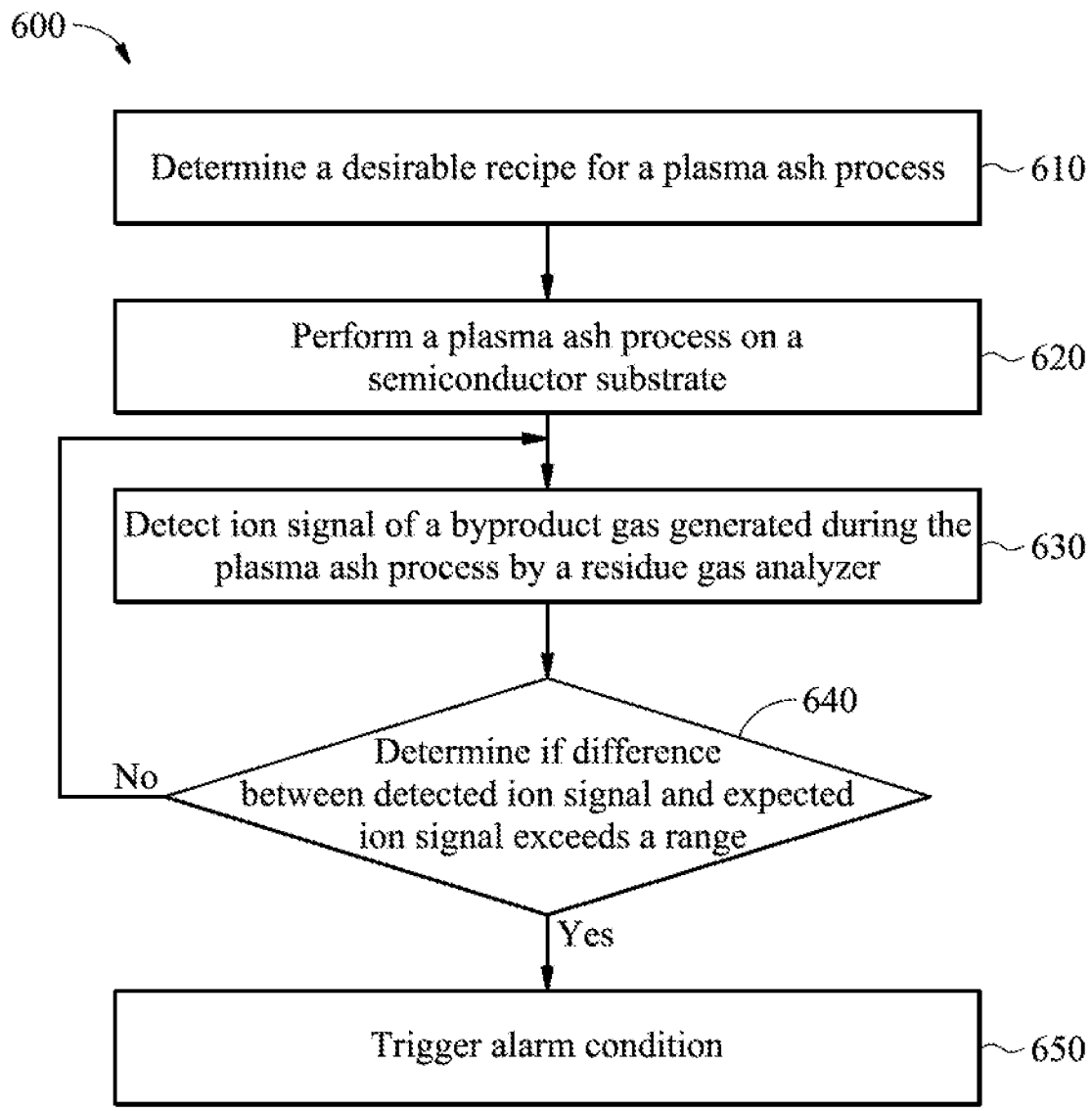
FIG. 6 is a simplified flowchart of a photoresist removal method using a residue gas analyzer for process real-time monitor defense in accordance with some embodiments.

Furthermore, the RGA 207 (FIG. 2) may also be used for real-time monitor defense during the plasma ash process performed in the photoresist removal apparatus 200 so as to avoid a lot of impact induced by tool etching rate shift or PR condition abnormal. FIG. 6 is a simplified flowchart of a photoresist removal method 600 using a residue gas analyzer for process real-time monitor defense in accordance with some embodiments. For illustration, the flow chart will be described with reference to the schematic views shown in FIGS. 2 and 7. Some of the operations described below can be replaced or eliminated in different embodiments. Alternatively, some operations may be added in different embodiments. The photoresist removal method 600 includes a number of operations (610, 620, 630, 640, 650).

In operation 610, a (desirable) process recipe for a plasma ash process (including several plasma ash processing steps) is determined. In some embodiments, a process recipe for a plasma ash process to be utilized in a photoresist removal apparatus (e.g., the photoresist removal apparatus 200 shown in FIG. 2) is determined according to operations 410-430 (FIG. 4) described above, and is not repeated here.

Furthermore, when determining the (desirable) process recipe for a plasma ash process, data associated with an ion signal related to a selected type of gas molecule in a byproduct gas discharged from the photoresist removal apparatus during the "tested" plasma ash process performed on a plurality of semiconductor substrate models described above (e.g., a number of semiconductor substrate models undergoing the "tested" plasma ash process with the (desirable) process recipe) is collected by a residue gas analyzer 207, and is stored in a database (not shown) of a control unit 208 (FIG. 2), in some embodiments. It should be understood that the data may be processed further before being stored in the database. For example, a mean value of ion signal detected in each time point (note that data of ion signal is detected multiple times in the tested plasma ash process at regular time intervals, such as every 0.5 seconds) of a number of "tested" plasma ash processes for the semiconductor substrate models are calculated and stored in the database. Accordingly, an expected ion signal curve (for example, see the curve depicted in thin line in FIG. 7) representing ion signal curve/change of a semiconductor substrate model during the "tested" plasma ash process with the (desirable) process recipe is derived from the database of the control unit 208.

In operation 620, a plasma ash process is then performed on a semiconductor substrate (which has the same structural configuration as the semiconductor substrate models described above) in the photoresist removal apparatus 200 to remove a photoresist layer from the semiconductor substrate. The plasma ash process utilizes the (desirable) process recipe obtained in operation 610, in some embodiments.

In operation 630, the residue gas analyzer 207 in the photoresist removal apparatus 200 is further used to detect ion signal related to a selected type of gas molecule (the same as the selected type of gas molecule in operation 610) in a byproduct gas discharged from the photoresist removal apparatus 200 during the plasma ash process in operation 620. The detection frequency (or time interval) of the residue gas analyzer 207 in operation 630 and operation 610 are the same, in some embodiments. Accordingly, an ion signal curve (for example, see the curve depicted in thick line in FIG. 7) of the semiconductor substrate during the plasma ash process in operation 620 is detected and obtained by residue gas analyzer 207, and then sent to the control unit 208 for further processing described below.

Figure 7:
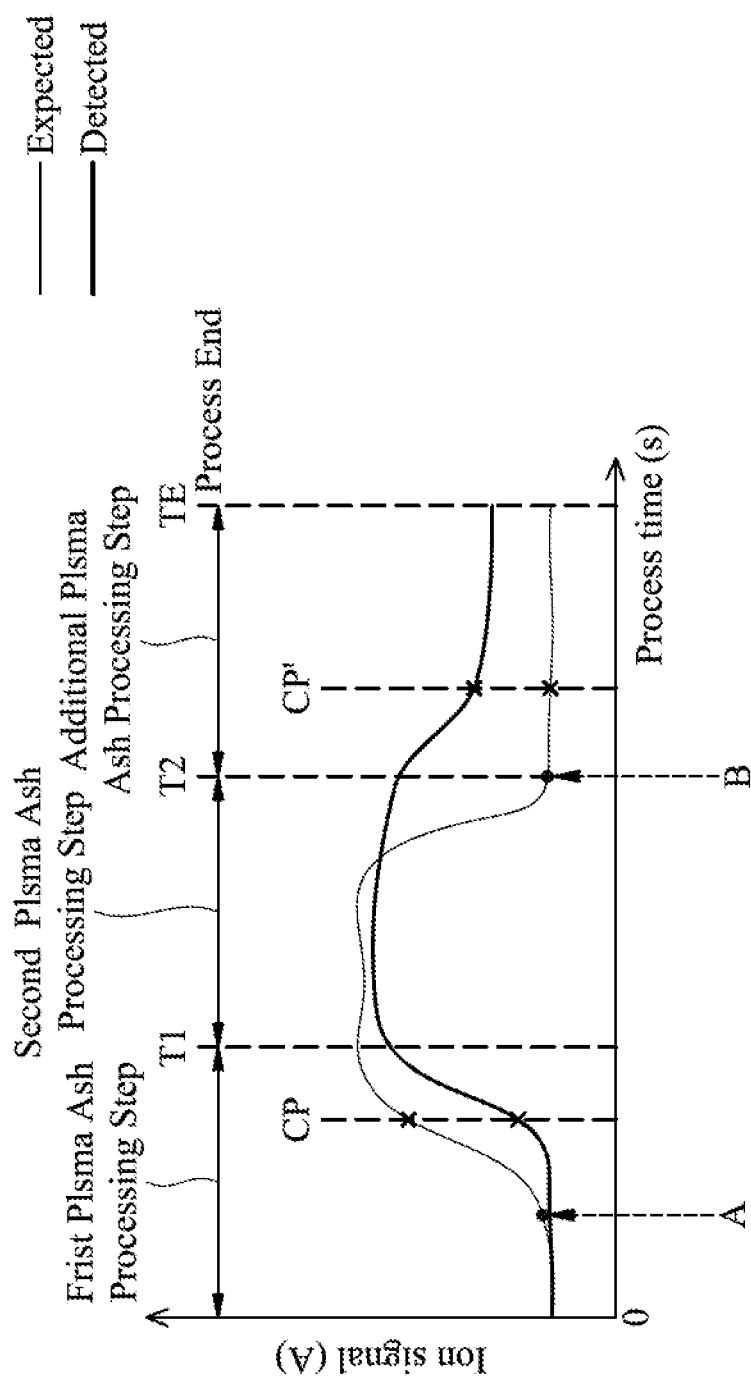
FIG. 7 is a diagram illustrating a comparison between the detection ion signal and the expected ion signal during the plasma ash process in accordance with some embodiments.

In operation 640, the ion signal that is detected at a selected time point is compared with the expected ion signal that is associated with the selected time point. In some embodiments, before analyzing the detected ion signal obtained in operation 630, a number of specific time points during the plasma ash process are determined or selected. As shown in FIG. 7, these include time point A, at which the crust layer 170 (FIG. 1D) is expected to be removed; time point B, at which the remaining photoresist layer 130 (FIGS. 1D-1E) is expected to be removed; time point CP, posterior to time point A; and time point CP', posterior to time point B.

The determination (e.g., by the operator or the control unit 208) of time point A and time point B is described above, and is not repeated here. In some embodiments, time point CP is the time point at which the photoresist removal may be adversely affected by the delayed removal of the crust layer 170. Time point CP' is the time point at which the photoresist removal may be adversely affected by the delayed removal of the photoresist layer 130. The operator may determine the time interval between time points A and CP and the time interval between time points B and CP', based on experience or experimental results, and make setting into the control unit 208, in some embodiments.

Next, a range is determined for the acceptable values associated with the selected time point (such as time point A, B, CP, or CP') for the difference between the expected ion single and the ion signal detected during the plasma ash process. The range of acceptable values may be a standard deviation of the expected ion signal in each plasma ash process for the above semiconductor substrate models, which can be calculated by the control unit 208, in some embodiments. Alternatively, the range of acceptable values may be determined by the operator based on experience or experimental results, and then the operator may make setting into the control unit 208, in some embodiments After the above specific time points during the plasma ash process and ranges of acceptable values associated with the selected time points are determined, the control unit 208 compares the ion signal detected by the residue gas analyzer 207 in operation 630 and the expected ion signal from the database associated with a selected time point to determine if the difference therebetween exceeds the range of acceptable values associated with the selected time point.

After the comparison, if the difference between the detected ion signal and the expected ion signal is within the range of acceptable values, the method 600 repeats operations 620-640 until the end of the plasma ash process. However, if the difference between the detected ion signal and the expected ion signal exceeds the range of acceptable values associated with a selected time point, the method 600 continues with operation 650, in which an alarm condition is indicated. For example, as shown in FIG. 7, the detected ion signal is lower than the expected ion signal by the range of acceptable values (e.g., one or more standard deviations) at the time point CP, or the detected ion signal is greater than the expected ion signal by the range of acceptable values (e.g., one or more standard deviations) at the time point CP'. Namely, the difference between the detected ion signal and the expected ion signal exceeds the range of acceptable values.

In some embodiments, when the control unit 208 indicates the detected ion signal have departed from the expected ion signal (in other words, when the control unit 208 detects an abnormality in the plasma ash process), the control unit 208 triggers an alarm. It is found that the abnormality in the plasma ash process can be induced by tool-etching rate-shift (e.g., exhibiting behavior associated with a process gas leakage or an RF power shift) or an abnormal PR condition, in some embodiments. Therefore, to protect the photoresist removal apparatus 200 or the semiconductor substrate W from being damaged, the control unit 208 triggers an alarm and notifies the operator to halt the process performed by the photoresist removal apparatus 200, take another action, or a combination thereof, so that any issues with the photoresist removal apparatus 200 or the semiconductor substrate W may be identified and remedied to avoid loss of the yield rate of photoresist removal process.

Figure 8:
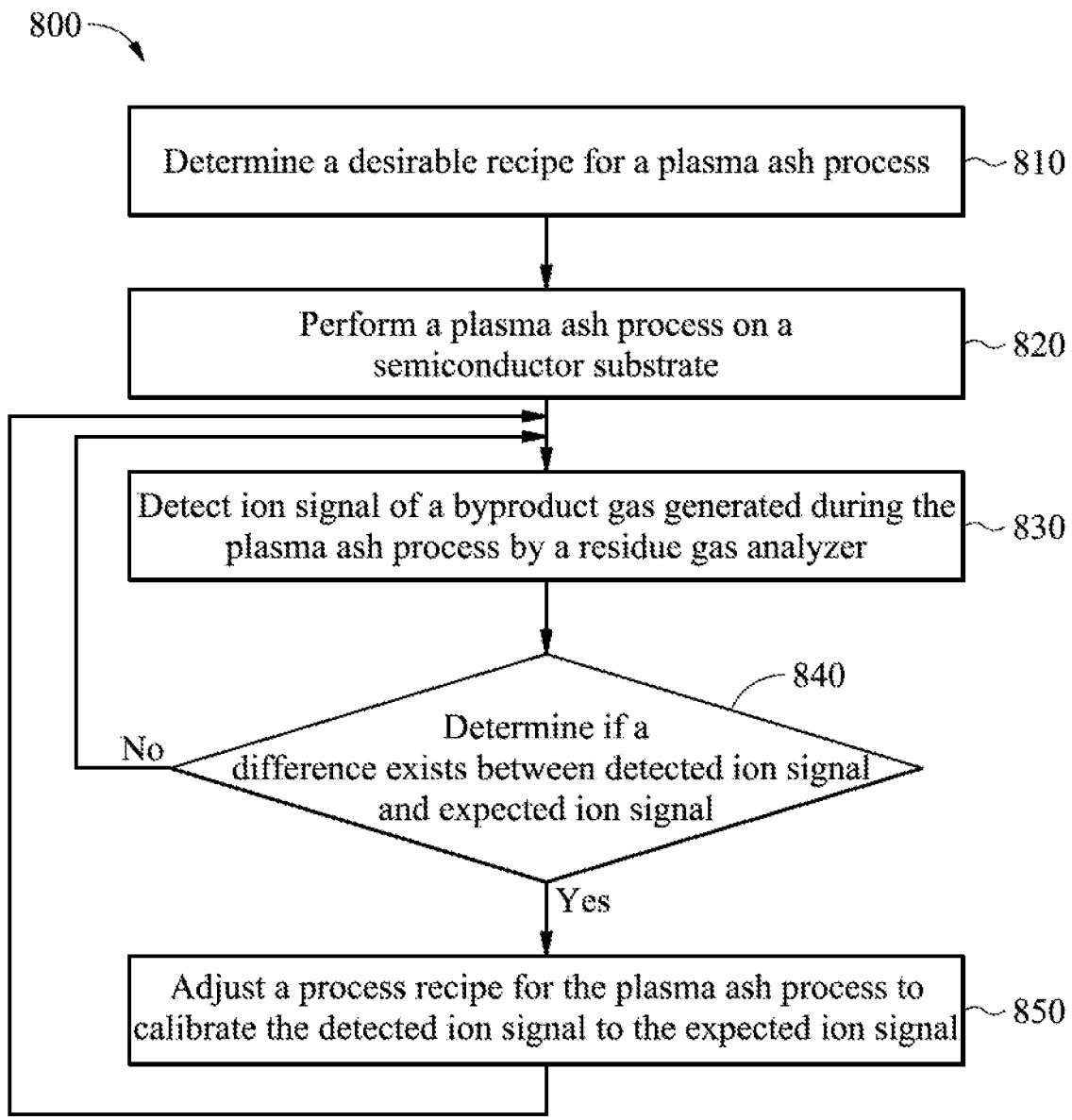
FIG. 8 is a simplified flowchart of a photoresist removal method using a residue gas analyzer for process real-time monitor defense in accordance with some embodiments.

FIG. 8 is a simplified flowchart of another photoresist removal method 800 using a residue gas analyzer for process real-time monitor defense in accordance with some embodiments. The photoresist removal method 800 includes a number of operations (810, 820, 830, 840, 850). It should be understood that the operations 810, 820, 830 of the method 800 are the same as or similar to the operations 610, 620, 630 of the method 600 described above, and are not repeated here.

In operation 840, the ion signal that is detected at a selected time point is compared with the expected ion signal that is associated with the selected time point. In some embodiments, the selected time point may be each time point detected by the residue gas analyzer 207 (FIG. 2). However, the selected time point may also include a number of specific time points during the plasma ash process, such as the time points A, B, CP and CP' as shown in FIG. 7, in some embodiments.

In some embodiments, the control unit 208 compares the ion signal detected by the residue gas analyzer 207 in operation 830 and the expected ion signal from the database associated with a selected time point (such as each of the detected time points) to determine if the difference therebetween exceeds the range of acceptable values associated with the selected time point.

Figure 9:
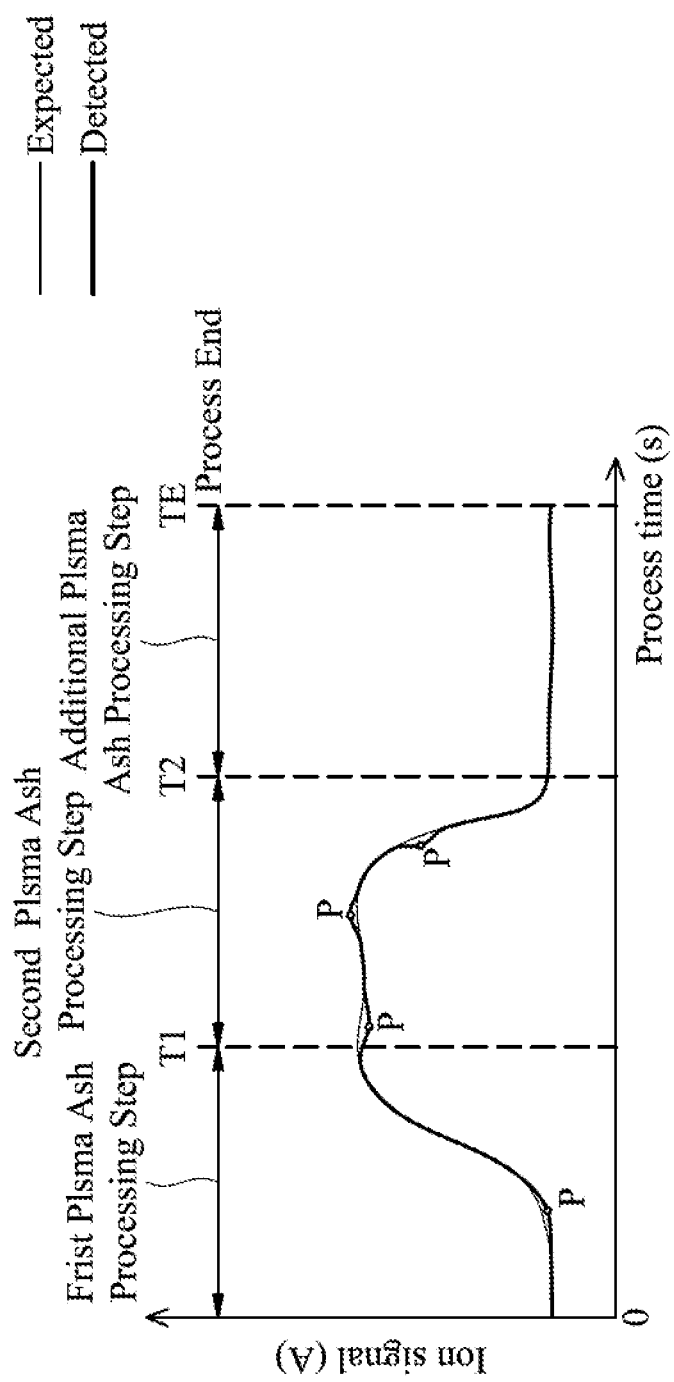
FIG. 9 is a diagram illustrating a real-time calibration of the ion signal during the plasma ash in accordance with some embodiments.

After the comparison, if there is no difference between the detected ion signal and the expected ion signal, the method 800 repeats operations 820-840 until the end of the plasma ash process. However, if the difference between the detected ion signal and the expected ion signal exists at a selected time point (for example, see the circled points P in FIG. 9), the method 800 continues with operation 850, in which a real-time calibration process is performed.

The real-time calibration process is performed by adjusting the process recipe for the current plasma ash processing step of the plasma ash process to real-time calibrate the detected ion signal to the expected ion signal, that is, to eliminate the difference therebetween. The adjustable process recipe include gas flow rate, RF power, and/or chamber pressure utilized in the photoresist removal apparatus in some embodiments. For example, when the detected ion signal is lower than the expected ion signal (which indicates the etching rate may be lower than the expected value), the control unit 208 (FIG. 2) may control at least one of the above process parameters to be properly increased to increase the etch rate. When the detected ion signal is greater than the expected ion signal (which indicates the etching rate may be greater than the expected value), the control unit 208 may control at least one of the above process parameters to be properly decreased to reduce the etch rate. Accordingly, the process condition during the plasma ash process is maintained as desired, thereby improving the yield rate of photoresist removal process.

It should be noted that the method 800 is merely an illustrative example, and some of the operations described above can be replaced or eliminated in different embodiments. Alternatively, some operations may be added in different embodiments. For example, if the difference between the detected ion signal and expected ion signal is found to be getting bigger (i.e., the difference cannot be calibrated successfully) at several successive detected time points, the control unit 208 may further trigger an alarm and notifies the operator to halt the process performed by the photoresist removal apparatus 200, take another action, or a combination thereof, so that any issues with the photoresist removal apparatus 200 or the semiconductor substrate W may be identified and remedied to avoid loss of the yield rate of photoresist removal process.

The embodiments of the present disclosure have some advantageous features: by providing a residue gas analyzer (RGA) in a photoresist removal apparatus to assist in tuning process recipe for the photoresist removal process so that the time required to remove the entire photoresist layer from the semiconductor substrate is reduced and fewer defects are generated during the photoresist removal process (i.e., the yield rate and the productivity are improved). Furthermore, the RGA may also be used to real-time monitor status of the photoresist removal process during the photoresist removal process, thereby avoiding a lot of impact induced by tool etching rate shift or PR condition abnormal.

An embodiment of a plasma ashing method is provided. The plasma ashing method includes analyzing the process status of each of a number of semiconductor substrate models undergoing a tested plasma ash process by a residue gas analyzer. The tested plasma ash processes for the semiconductor substrate models utilize a plurality of tested recipes. The plasma ashing method further includes selecting one of the tested recipes as a process recipe for a plasma ash process.

Another embodiment of a plasma ashing method is provided. The plasma ashing method includes detecting an ion signal related to a selected type of gas molecule in a byproduct gas discharged from a plasma ashing apparatus during a plasma ash process by a residue gas analyzer. The plasma ashing method further includes comparing the ion signal detected at a selected time point with an expected ion signal associated with the selected time point to determine if the difference between the detected ion signal and the expected ion signal exceeds the range of acceptable values associated with the selected time point.

Another embodiment of a plasma ashing method is provided. The plasma ashing method includes detecting an ion signal related to a selected type of gas molecule in a byproduct gas discharged from a plasma ashing apparatus during a plasma ash process by a residue gas analyzer. The plasma ashing method also includes comparing the ion signal detected at a selected time point with an expected ion signal associated within the selected time point. In addition, the plasma ashing method includes adjusting a process recipe for the plasma ash process to calibrate the detected ion signal with the expected ion signal.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A plasma ashing method, comprising:
   analyzing a process status of each of a plurality of semiconductor substrate models undergoing a tested plasma ash process by a residue gas analyzer, wherein the tested plasma ash processes for the semiconductor substrate models utilize a plurality of tested recipes; and
   selecting one of the tested recipes as a process recipe for a plasma ash process.

2. The plasma ashing method as claimed in claim 1, wherein the analyzing comprises detecting an ion signal related to a selected type of gas molecule in a byproduct gas generated during the tested plasma ash process by the residue gas analyzer.

3. The plasma ashing method as claimed in claim 1, wherein the process status includes a time point at which a crust layer over a photoresist layer on the semiconductor substrate model is removed, a time point at which removal of the photoresist layer ends, and a period of over ash.

4. The plasma ashing method as claimed in claim 1, further comprising inspecting each of the semiconductor substrate models after the tested plasma ash process to determine an amount of defects generated during the tested plasma ash process.

5. The plasma ashing method as claimed in claim 1, wherein the process recipe comprises a set of process parameters including process gas type, gas flow rate, RF power, chamber pressure, and/or processing time.

6. The plasma ashing method as claimed in claim 5, wherein the plasma ash process includes a first plasma ash processing step and a second plasma ash processing step, and the process recipe used in the first plasma ash processing step is different from the process recipe used in the second plasma ash processing step.

7. The plasma ashing method as claimed in claim 6, wherein the plasma ash process further includes an additional plasma ash processing step after the second plasma ash processing step, and the process recipe used in the additional plasma ash processing step is different from the process recipe used in the second plasma ash processing step.

8. The plasma ashing method as claimed in claim 2, further comprising:
   performing the plasma ashing process on a semiconductor substrate; and
   analyzing the process status of the semiconductor substrate during the plasma ashing process by the residue gas analyzer.

9. The plasma ashing method as claimed in claim 8, wherein a detection frequency of the residue gas analyzer in the plasma ashing process is the same as a detection frequency of the residue gas analyzer in the tested plasma ash process.

10. A plasma ashing method, comprising:
    detecting an ion signal related to a selected type of gas molecule in a byproduct gas discharged from a plasma ashing apparatus during a plasma ash process by a residue gas analyzer; and
    comparing the ion signal detected at a selected time point with an expected ion signal associated with the selected time point to determine if a difference between the detected ion signal and the expected ion signal exceeds a range of acceptable values associated with the selected time point.

11. The plasma ashing method as claimed in claim 10, further comprising stopping operation of the plasma ashing apparatus when the difference between the detected ion signal and the expected ion signal exceeds the range of acceptable values associated with the selected time point.

12. The plasma ashing method as claimed in claim 10, wherein the plasma ash process is used to remove a photoresist layer from a semiconductor substrate, and wherein the selected time point is posterior to a specific time point, and the specific time point is the time point at which a crust layer over the photoresist layer is expected to be removed.

13. The plasma ashing method as claimed in claim 10, wherein the plasma ash process is used to remove a photoresist layer from a semiconductor substrate, and wherein the selected time point is posterior to a specific time point, and the specific time point is the time point at which the photoresist layer is expected to be removed.

14. The plasma ashing method as claimed in claim 10, wherein the plasma ash process is used to remove a photoresist layer from a semiconductor substrate, and wherein the selected time point is the time point at which a crust layer over the photoresist layer is expected to be removed.

15. The plasma ashing method as claimed in claim 10, wherein the plasma ash process is used to remove a photoresist layer from a semiconductor substrate, and wherein the selected time point is the time point at which the photoresist layer is expected to be removed.

16. The plasma ashing method as claimed in claim 10, further comprising:
    collecting data associated with an ion signal related to a selected type of gas molecule in a byproduct gas discharged from the plasma ashing apparatus during a tested plasma ash process performed prior to the plasma ash process; and
    storing the data associated with the ion signal in a database, wherein the expected ion signal is derived from the database.

17. A plasma ashing method, comprising:
    detecting an ion signal related to a selected type of gas molecule in a byproduct gas discharged from the plasma ashing apparatus during a plasma ash process by a residue gas analyzer;

comparing the ion signal detected at a selected time point with an expected ion signal associated within the selected time point; and adjusting a process recipe for the plasma ash process to calibrate the detected ion signal with the expected ion signal.

18. The plasma ashing method as claimed in claim 17, wherein the process recipe comprises gas flow rate, RF power, and/or chamber pressure utilized in the plasma ashing apparatus.

19. The plasma ashing method as claimed in claim 17, wherein the plasma ash process includes a first plasma ash processing step and a second plasma ash processing step, and the selected time point is in at least one of the first plasma ash processing step and the second plasma ash processing step.

20. The plasma ashing method as claimed in claim 17, wherein the adjustment of the process recipe is performed in real-time.

* * * * *